(12) United States Patent
Ma et al.

(10) Patent No.: US 10,580,848 B1
(45) Date of Patent: Mar. 3, 2020

(54) ORGANIC LIGHT-EMITTING DISPLAY PANEL AND ORGANIC LIGHT-EMITTING DISPLAY DEVICE

(71) Applicant: WuHan TianMa Micro-electronics Co., Ltd, Wuhan (CN)

(72) Inventors: Yangzhao Ma, Wuhan (CN); Tao Peng, Wuhan (CN); Yongzhi Wang, Wuhan (CN)

(73) Assignee: WuHan TianMa Micro-electronics Co., Ltd, Wuhan (CN)

( * ) Notice: Subject to any disclaimer, the term of this patent is extended or adjusted under 35 U.S.C. 154(b) by 0 days.

(21) Appl. No.: 16/202,049

(22) Filed: Nov. 27, 2018

(30) Foreign Application Priority Data

Aug. 15, 2018 (CN) .......................... 2018 1 0927029

(51) Int. Cl.
*H01L 35/24* (2006.01)
*H01L 51/00* (2006.01)
*H01L 27/32* (2006.01)

(52) U.S. Cl.
CPC ...... *H01L 27/3276* (2013.01); *H01L 27/3225* (2013.01); *H01L 51/0096* (2013.01)

(58) Field of Classification Search
CPC ............. H01L 27/3276; H01L 27/3225; H01L 51/0096
USPC .......................................................... 257/40
See application file for complete search history.

(56) References Cited

U.S. PATENT DOCUMENTS

| 2017/0162111 A1* | 6/2017 | Kang | G09G 3/3233 |
| 2019/0139477 A1* | 5/2019 | Chen | G09G 3/20 |
| 2019/0198802 A1* | 6/2019 | Lee | H01L 51/5246 |

FOREIGN PATENT DOCUMENTS

CN 107025875 A 8/2017

* cited by examiner

*Primary Examiner* — David S Blum
(74) *Attorney, Agent, or Firm* — Christensen O'Connor Johnson Kindness PLLC

(57) ABSTRACT

The present disclosure provides an organic light-emitting display panel and device. The organic light-emitting display panel includes pixel units; gate lines; and data lines intersecting with and insulated from the gate lines. None of the pixel units is provided within the hollow area, and the pixel units are provided in a periphery of the hollow area. The display area includes a full display area and a half display area, and the full display area includes first to fifth display regions. The first display region, the hollow area and the second display region are sequentially arranged along a first direction. The half display area, the hollow area, and the third display region are sequentially arranged along a second direction. A number of pixel units per unit area in the full display area is greater than a number of pixel units per unit area in the half display area.

22 Claims, 16 Drawing Sheets

US 10,580,848 B1

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims priority to Chinese Patent Application No. 201810927029.2, filed on Aug. 15, 2018, the content of which is incorporated herein by reference in its entirety.

TECHNICAL FIELD

The present disclosure relates to display technology, and more particularly, to an organic light-emitting display panel and an organic light-emitting display device.

BACKGROUND

According to the existing organic light-emitting display device technology, the organic light-emitting display panels are mainly divided into two main categories: liquid crystal organic light-emitting display panel and organic self-luminous organic light-emitting display panel. The liquid crystal organic light-emitting display panel forms an electric field capable of controlling a deflection of liquid crystal molecules by applying a voltage on a pixel electrode and a common electrode, and thus exerts the display function of the organic light-emitting display panel by controlling the transmission of light. In contrast, the organic self-luminous organic light-emitting display panel adopts an organic electroluminescent material, and when electric current passes through the organic electroluminescent material, the luminescent material emits light, thereby exerting the display function of the organic light-emitting display panel.

With the application of the display technology in smart wearable devices and other portable electronic devices, the electronic products are designed to constantly pursue performance that can achieve the user-friendly experience and improve the sensory experience of users at the same time, including a wide viewing angle, a high resolution, a narrow frame, a high screen-to-body ratio, etc.

Therefore, an urgent technical problem to be solved in the related art is to provide an organic light-emitting display panel and an organic light-emitting display device with a high screen-to-body ratio, which can effectively utilize an area around a camera, an earpiece, or a sensor for displaying.

SUMMARY

The present disclosure provides an organic light-emitting display panel and an organic light-emitting display device.

In a first aspect of the present disclosure, an organic light-emitting display panel is provided. The organic light-emitting display panel has a hollow area and a display area surrounding the hollow area. The organic light-emitting display panel includes: a plurality of pixel units; a plurality of gate lines; and a plurality of data lines. The plurality of data lines and the plurality of gate lines intersect with one another, and the plurality of data lines are insulated from the plurality of gate lines. None of the plurality of pixel units is provided within the hollow area, and the plurality of pixel units is provided in a periphery of the hollow area. The display area includes a full display area and a half display area, and the full display area includes a first display region, a second display region, a third display region, a fourth display region, and a fifth display region. The first display region, the hollow area and the second display region are sequentially arranged along a first direction. The half display area, the hollow area, and the third display region are sequentially arranged along a second direction. A number of pixel units per unit area in the full display area is greater than a number of pixel units per unit area in the half display area.

In a second aspect of the present disclosure, an organic light-emitting display device is provided. The organic light-emitting display device includes the organic light-emitting display panel according to the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "I" herein generally indicates that the related objects before and after the character form an "or" relationship.

It should be understood that the terms "first", "second", "third" and the like used to describe display regions, data lines, power supply signal lines, and pixel units in the embodiments of the present disclosure are not intended to limit them. These terms merely serves to distinguish display regions, data lines, power supply signal lines, and pixel units from each other. For example, without departing from the scope of the embodiments of the present disclosure, a first display region, a first data line, a first power supply signal line, and a first pixel unit also can be referred as a second display region, a second data line, a second power supply signal line, and a second pixel unit, respectively, and vice versa.

Figure 1:
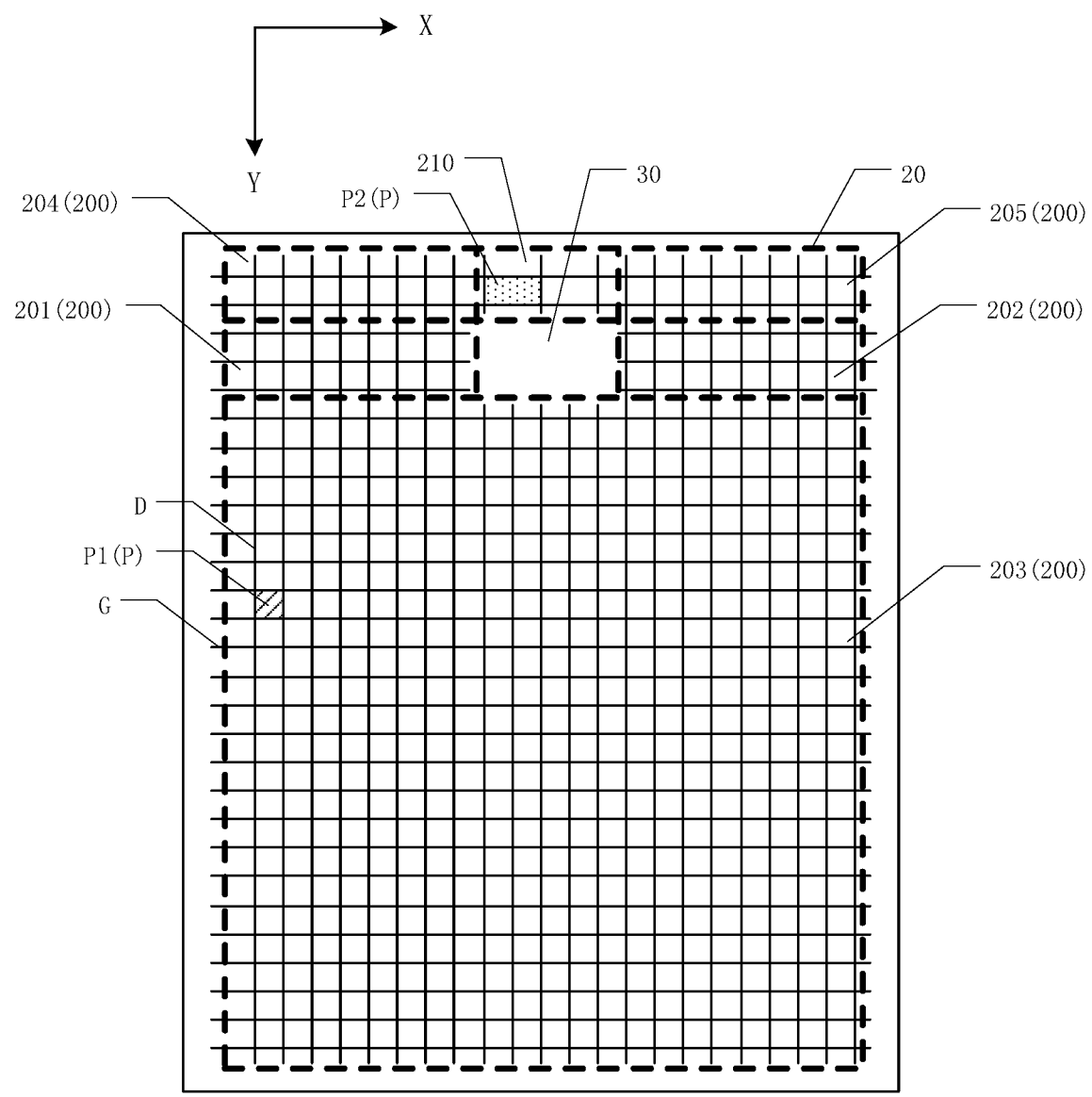
FIG. 1 is a top view of an organic light-emitting display panel according to an embodiment of the present disclosure.

An organic light-emitting display panel 100 according to an embodiment of the present disclosure, as shown in FIG. 1, includes a hollow area 30 and a display area 20 surrounding the hollow area 30. The organic light-emitting display panel 100 further includes a plurality of pixel units P, a plurality of gate lines G, and a plurality of data lines D. Each data line D intersects with each gate line G. Each data line D is insulated from each gate line G.

Referring to FIG. 1, no pixel unit P is provided within the hollow area 30, and the plurality of pixel units P is provided in the periphery of the hollow area 30. That is, the hollow area 30 does not have a display function, and both sides of the hollow area 30 are transmissive due to the absence of the pixel units P, i.e., the hollow area 30 is visible when being viewed from any side of the organic light-emitting display panel 100 to the other side. It should be understood that, "no pixel unit P is provided in the hollow area 30" means that neither an organic light-emitting display component that blocks light transmission (i.e., an anode, a light-emitting layer and a cathode) nor a pixel driving circuit that drives the organic light-emitting display component to emit light (i.e., a transistor and a capacitor) is provided in the hollow area 30.

Referring to FIG. 1 again, the display area 20 includes a full display area 200 and a half display area 210. The full display area 200 includes a first display region 201, a second display region 202, a third display region 203, a fourth display region 204, and a fifth display region 205. The first display region 201, the hollow area 30 and the second display region 202 are sequentially arranged along a first direction X. That is, on the organic light-emitting display panel 100, along the first direction X, the first display region 201, the hollow area 30 and the second display region 202 are arranged in an order such that the hollow area 30 is disposed between the first display region 201 and the second display region 202. The half display area 210, the hollow area 30, and the third display region 203 are sequentially arranged along a second direction Y. That is, on the organic light-emitting display panel 100, along the second direction Y, the half display area 210, the hollow area 30 and the third display region 203 are arranged in an order such that the hollow area 30 is disposed between the half display area 210 and the third display region 203. As shown in FIG. 1, the half display area 210, the first display region 201, the second display region 202, the third display region 203, the fourth display region 204 and the fifth display region 205 are arranged around the hollow area 30.

Figure 2:
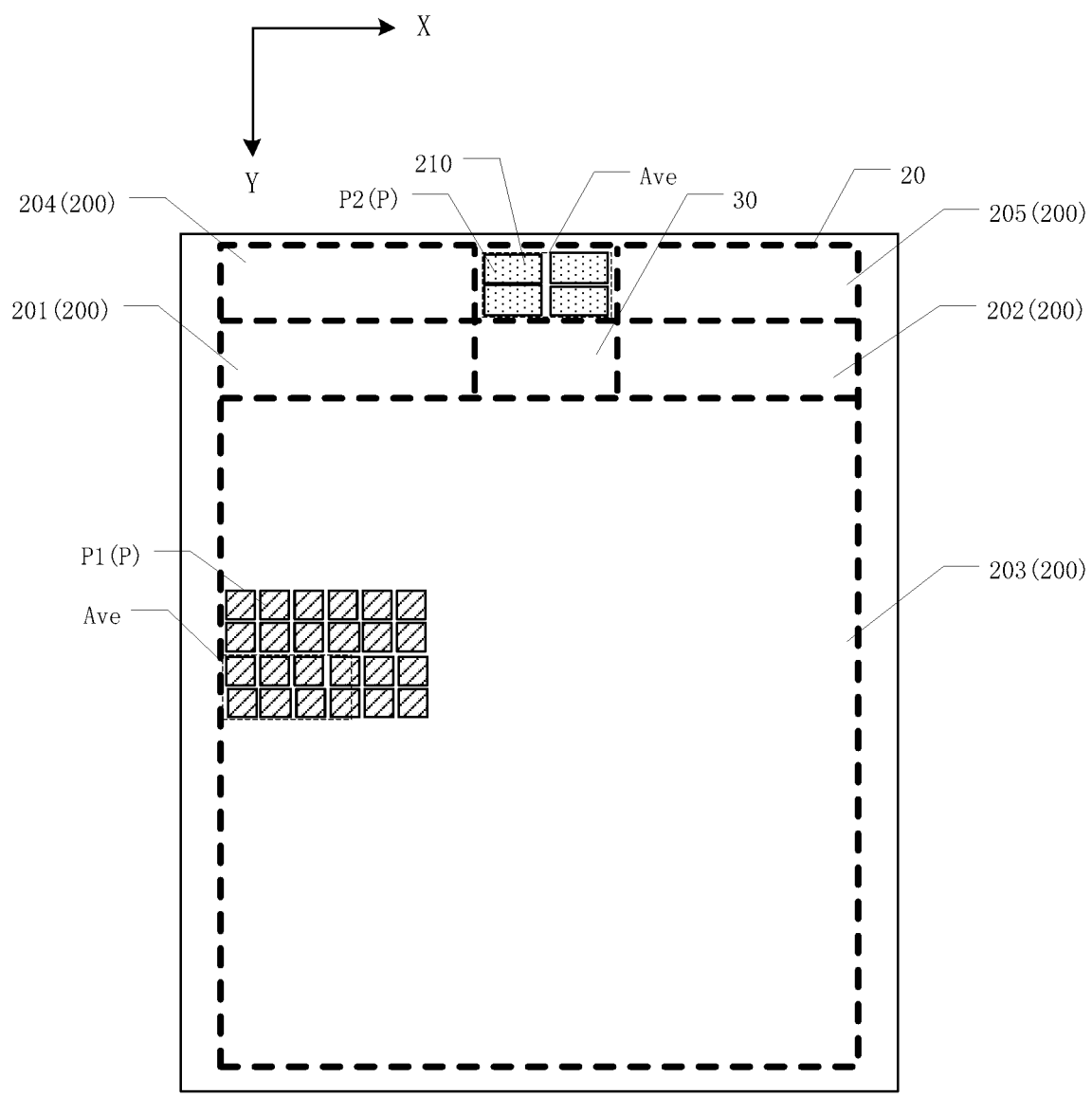
FIG. 2 is a top view of another organic light-emitting display panel according to another embodiment of the present disclosure.

Referring to FIGS. 1 and 2, the plurality of pixel units P includes first pixel units P1 and second pixel units P2. The first pixel units P1 are located only in the full display area 200, and the second pixel units P2 are located only in the half display area 210. A number of the first pixel units P1 per unit area Ave of the full display area 200 is greater than a number of the second pixel units P2 per unit area Ave of the half display area 210. It should be understood that the unit area Ave can be 1 cm$^2$ or other reference areas, as long as a same area of the full display area 200 and the half display area 210 is selected to compare the number of the first pixel units P1 per unit area Ave of the full display area 200 and the number of the second pixel units P2 per unit area Ave of the half display area 210. FIG. 2 only illustrates a manner of selecting the unit area Ave, in which more than 6 first pixel units P1 are located in one unit area Ave of the full display area 200, and 4 second pixel units P2 are located in one unit area Ave of the half display area 210. That is, in the unit area Ave, the number of the first pixel units P1 is greater than the number of the second pixel units P2.

In the organic light-emitting display panel 100 provided by the embodiment of the present disclosure, the hollow area 30, the half display area 210 and the full display area 200 surrounding the hollow area 30 are provided, and the number of the pixel units P per unit area Ave of the full display area 200 is larger than the number of the pixel units P per unit area Ave of the half display area 210. In this way, it is possible in the organic light-emitting display panel 100 that not only an independent sensor module or acquisition module can be provided in the hollow area 30, but a sensing unit located in the organic light-emitting display panel 100 can be integrated in the half display area 210 and serve to display. Therefore, a ratio of a displayable area of the organic light-emitting display panel 100 to a total area of the organic light-emitting display panel 100 is increased, which can improve the user experience.

Figure 3:
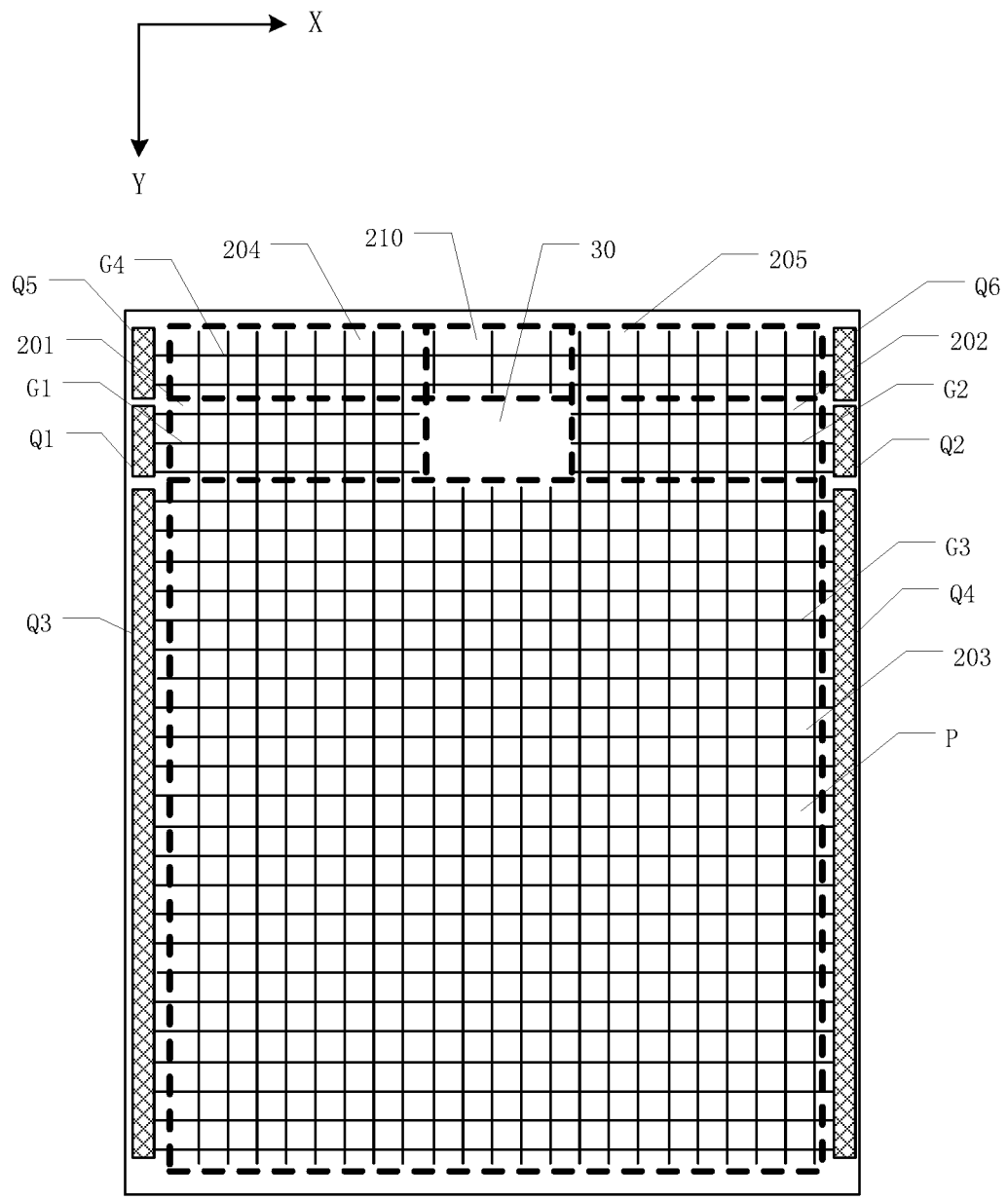
FIG. 3 is a top view of yet another organic light-emitting display panel according to yet another embodiment of the present disclosure.

According to another embodiment of the present disclosure, as shown in FIG. 3, the organic light-emitting display panel 100 further includes a first gate driving unit Q1 and a second gate driving unit Q2. The first gate driving unit Q1, the first display region 201, the hollow area 30, the second display region 202, and the second gate driving unit Q2 are sequentially arranged in the first direction X. That is, in the first direction X, the first gate driving unit Q1, the first display region 201, the hollow area 30, the second display region 202, and the second gate driving unit Q2 are arranged in an order such that the first gate driving unit Q1 is located at a side of the first display region 201 away from the hollow area 360 and the second gate driving unit Q2 is located at a side of the second display region 202 away from the hollow area 30.

Referring to FIG. 3, the pixel units P located in the first display region 201 are electrically connected to the first gate driving unit Q1 and are insulated from the second gate driving unit Q2. The pixel units P located in the second display region 202 are electrically connected to the second gate driving unit Q2 and are insulated from the first gate driving unit Q1. That is, the pixel units at one side of the hollow area 30 are separated by the hollow area 30 from those at the other side, and the pixel units at each side are driven separately. In other words, no gate driving unit is arranged between the hollow area 30 and the first display region 201 to drive the pixel units P in the first display region 201, and no gate driving unit is arranged between the hollow area 30 and the second display region 202 to drive the pixel units P in the second display region 202.

Still referring to FIG. 3, the organic light-emitting display panel 100 further includes first gate lines G1 located in the first display region 201 and second gate lines G2 located in the second display region 202. The hollow area 30 is located between the first gate lines G1 and the second gate lines G2 so as to insulate the first gate lines G1 from the second gate lines G2. Each first gate line G1 has a first end electrically connected to the first gate driving unit Q1, and a second end insulated from the second ends of other first gate lines G1. Each second gate line G2 has a first end electrically connected to the second gate driving unit Q2, and a second end insulated from the second ends of other second gate lines G2. That is, the gate lines at one side of the hollow area 30 are separated by the hollow area 30 from those at the other side, and the gate lines at each side are driven separately. In other words, no gate driving unit is arranged between the hollow area 30 and the first display region 201 for electrically connecting to the first gate lines G1, and no gate driving unit is arranged between the hollow area 30 and the second display region 202 for electrically connecting to the second gate lines G2.

In the organic light-emitting display panel 100 provided by the embodiment of the disclosure, the pixel units at each side of the two sides of the hollow area 30 are driven separately, so that the gate driving unit at the other side of the first display region 201 and the gate driving unit at the other side of the second display region 202 can be omitted. In this way, width of frame at both sides of the hollow area 30 can be reduced, so as to form a narrow frame of the hollow area 30 and thus increase a screen-to-body ratio. In addition, since a number of pixel units in regions at both sides of the hollow area 20 is smaller than a number of pixel units arranged in rows along the first direction in the other regions, the driving capability of the organic light-emitting display panel 100 will not be affected by the single-side driving. Therefore, the organic light-emitting display panel 100 according to the embodiment of the present disclosure can achieve a narrow frame under the premise of ensuring the driving capability.

Further referring to FIG. 3, the organic light-emitting display panel 100 further includes a third gate driving unit Q3, a fourth gate driving unit Q4, a fifth gate driving unit Q5, and a sixth gate driving unit Q6.

The third gate driving unit Q3, the third display region 203, and the fourth gate driving unit Q4 are sequentially arranged along the first direction X. That is, in the first direction X, the third gate driving unit Q3, the third display region 203, and the fourth gate driving unit Q4 are arranged in an order such that the third display region 203 is located between the third gate driving unit Q3 and the fourth gate driving units Q4. The pixel units P located in the third display region 203 are electrically connected to both the third gate driving unit Q3 and the fourth gate driving unit Q4. In other words, the pixel units P in the third display region 203 are driven at two sides.

The fifth gate driving unit Q5, the fourth display region 204, the half display area 210, the fifth display region 205 and the sixth gate driving unit Q6 are sequentially arranged along the first direction X. That is, in the first direction X, the fifth gate driving unit Q5, the fourth display region 204, the half display area 210, the fifth display region 205 and the sixth gate driving unit Q6 are arranged in an order such the fifth gate driving unit Q5 is located at a side of the fourth display region 204 away from the half display area 210, and the sixth gate driving unit Q6 is located at a side of the fifth display region 205 away from the half display area 210. The pixel units P located in the fourth display region 204, the half display area 210 and the fifth display region 205 are electrically connected to both the fifth gate driving unit Q5 and the sixth gate driving unit Q6. In other words, the pixel units P in the fourth display region 204, the half display area 210 and the fifth display region 205 are driven at two sides.

Further referring FIG. 3, the organic light-emitting display panel 100 further includes third gate lines G3 located in the third display region 203 and fourth gate lines G4. Each third gate line G3 has a first end electrically connected to the third gate driving unit Q3, and a second end electrically connected to the fourth gate driving unit Q4. That is, the third gate lines G3 located in the third display region 203 are electrically connected to the pixel units P of the in the third display region 203, and driven at two sides.

Along the first direction X, the fourth gate lines G4 extend from the fourth display region 204 to the fifth display region 205 through the half display area 210. Each fourth gate line G4 has a first end electrically connected to the fifth gate driving unit Q5, and a second end electrically connected to the sixth gate driving unit Q6. That is, the fourth gate lines G4 extend over the fourth display region 204, the half display area 210 and the fifth display region 205, and are electrically connected to the pixel units P located therein and driven at two ends.

As shown in FIG. 3, the third display region 203 is located on a side of the first display region 201, the hollow area 30 and the second display region 202, and is not split by the hollow area 30. The pixels units P located in the third display region 203 are arranged in an entire row in the first direction X, and the number of the pixel units P in the third display region 203 is larger. The two-side driving can improve the driving capability of the organic light-emitting display panel 100, the response speed of the third display region 203, and the user experience. Similarly, the fourth display region 204, the half display area 210, and the fifth display region 205 are not split by the hollow area 30. The pixel units P located therein are arranged in an entire row in the first direction X. The number of pixel units P located in the fourth display region 204, the half display area 210 and the fifth display region 205 is smaller than that in the third display region 203, due to the decreased number of pixel units P in the half display area 210. However, the presence of the first gate driving unit Q1 and the second gate driving unit Q2 at both sides of the display area reserves space for the fifth gate driving unit Q5 and the sixth gate driving unit Q6 to be arranged above the first gate driving unit Q1 and the second gate driving unit Q2, respectively, so as to drive the pixel units P in the fourth display region 204, the half display area 210 and the fifth display region 205 at two side, without additionally occupying more space of the frame.

Therefore, the organic light-emitting display panel 100 according to the embodiment of the present disclosure can effectively utilize the frame region to perform single-side driving and two-side driving in different regions, thereby reducing the width of the frame on both sides of the hollow area 30 and improving the driving capability and response speed of the organic light-emitting display panel 100 and the user experience.

Figure 4:
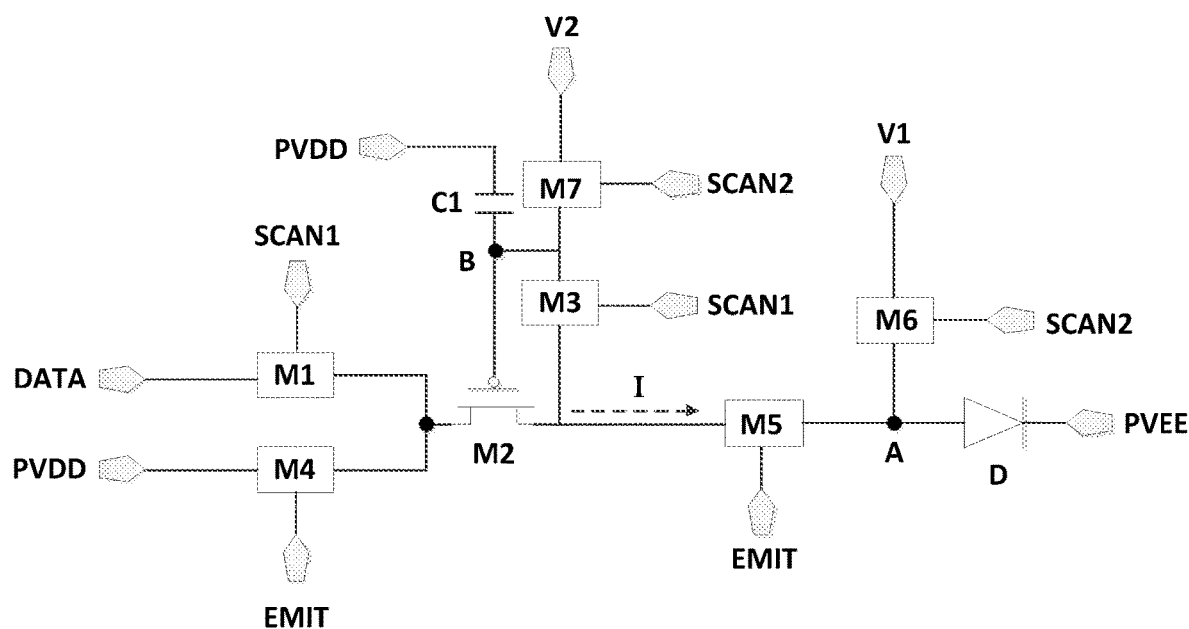
FIG. 4 is a schematic diagram of a pixel driving circuit of an organic light-emitting display panel according to an embodiment of the present disclosure.

Referring to FIG. 1 and FIG. 4, one pixel unit P of the organic light-emitting display panel 100 includes a pixel driving circuit, a gate line G configured to provide scan signals SCAN1 and SCAN2 to the pixel driving circuit, and a data line D configured to provide a data signal DATA to the pixel driving circuit. The organic light-emitting display panel may further include a power supply signal line and a light emission control line. The power supply signal line provides a power supply signal PVDD to the pixel driving circuit, and the light emission control line provides a light emission control signal EMIT to the pixel driving circuit. FIG. 4 merely shows one of the pixel driving circuits of the organic light-emitting display panel 100 according to an embodiment of the present disclosure. In other embodiments of the present disclosure, the pixel driving circuit may also adopt other layouts and driving modes, as long as the pixel driving circuit can drive the light-emitting elements to emit light by using the scan signals SCAN1 and SCAN2 provided by the gate line G, the data signal DATA provided by the data line D, the power supply signal PVDD provided by the power supply signal line, and the light emission control signal EMIT provided by the light emission control line.

As an example, FIG. 4 illustrates a layout and driving mode of the pixel driving circuit of the pixel unit P. The pixel driving circuit of the organic light-emitting display panel 100 according to the embodiment of the present disclosure includes first to seventh transistors M1 to M7.

The first transistor M1 is configured to transmit the data signal DATA in response to the first scan signal SCAN1. The second transistor M2 is configured to generate a driving current I under control of the data signal DATA transmitted through the first transistor M1. The third transistor M3 is configured to detect and self-compensate a threshold voltage deviation of the second transistor M2. The fourth transistor M4 is configured to transmit the power supply signal VDD to the second transistor M2 in response to the light emission control signal EMIT. The fifth transistor M5 is configured to transmit the driving current I generated by the second transistor M2 to the light-emitting element D in response to the light emission control signal EMIT, and the light-emitting element D is configured to emit light under control of the driving current I. The sixth transistor M6 is configured to transmit a signal having a first potential V1 to the light-emitting element D in response to the second scan signal SCAN2. The seventh transistor M7 is configured to transmit a signal having a second potential V2 to a gate of the second transistor M2 in response to the second scan signal SCAN2.

Figure 5:
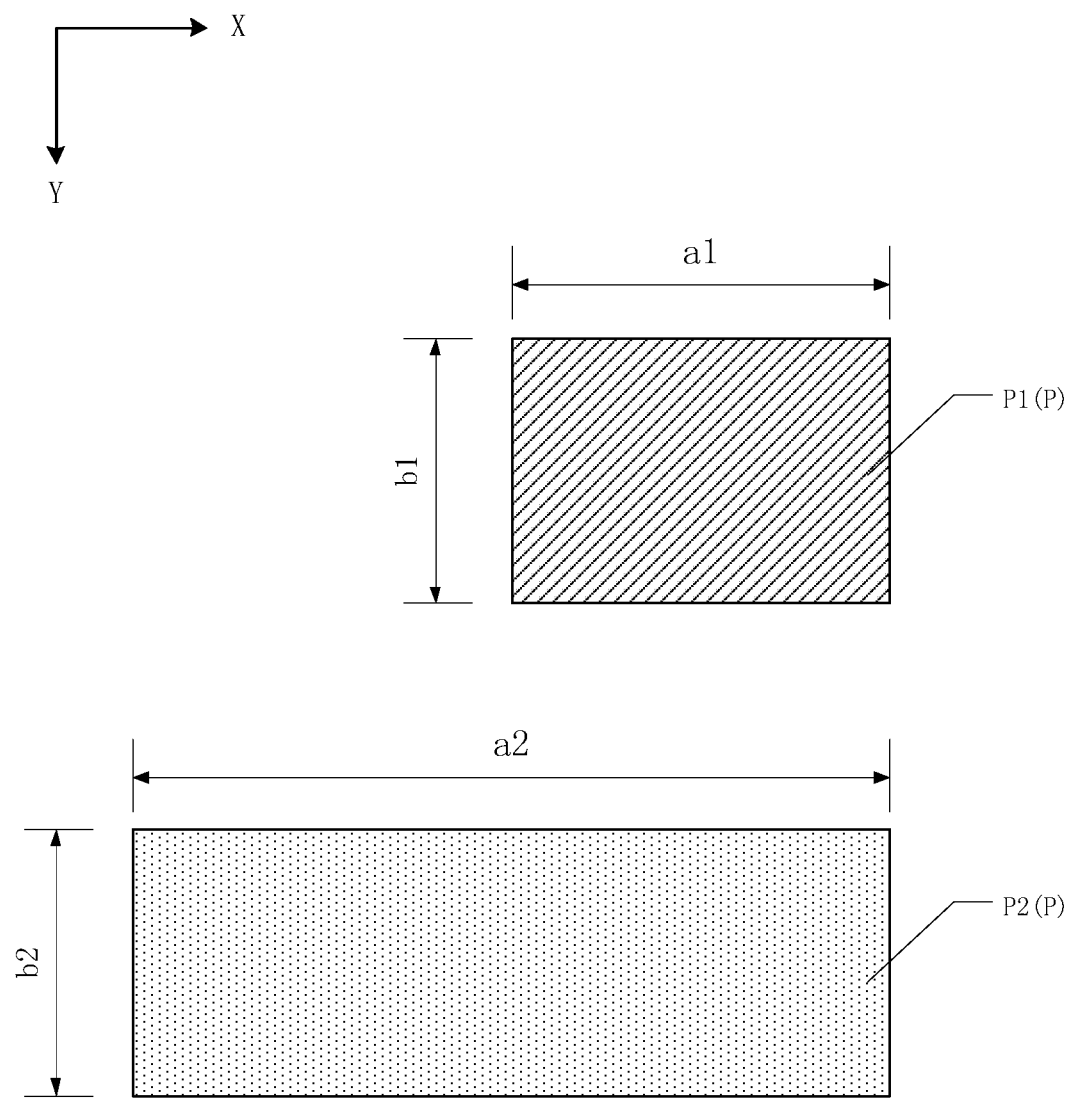
FIG. 5 is a schematic diagram of a first pixel unit and a second pixel unit of an organic light-emitting display panel according to an embodiment of the present disclosure.

Referring to FIG. 1 and FIG. 5, the pixel units P of the organic light-emitting display panel 100 according to an embodiment of the present disclosure include first pixel units P1 and second pixel units P2. The first pixel units P1 are located in the full display area 200, and the second pixel units P2 are located in the half display area 210. A length a1 of the first pixel unit P1 in the first direction X is smaller than a length a2 of the second pixel unit P2 in the first direction X.

In addition, a width b1 of the first pixel unit P1 in the second direction Y is equal to a width b2 of the second pixel unit P2 in the second direction Y.

In the organic light-emitting display panel 100 according to the embodiment of the present disclosure, by setting the width b1 of the first pixel unit P1 in the second direction Y and the width b2 of the second pixel unit P2 in the second direction Y to be equal, a same row of the pixel units P located in the fourth display region 204, the fifth display region 205 and the half display area 210 can be electrically connected to a same gate line G. In this way, the gate lines G can be easily arranged, without being bent or winded, such that the gate lines G in the fourth display region 204, the fifth display region 205 and the half display area 210 have a same driving capability as the gate lines G in the third display region 203, thereby ensuring an uniformity of the organic light-emitting display panel.

Figure 6:
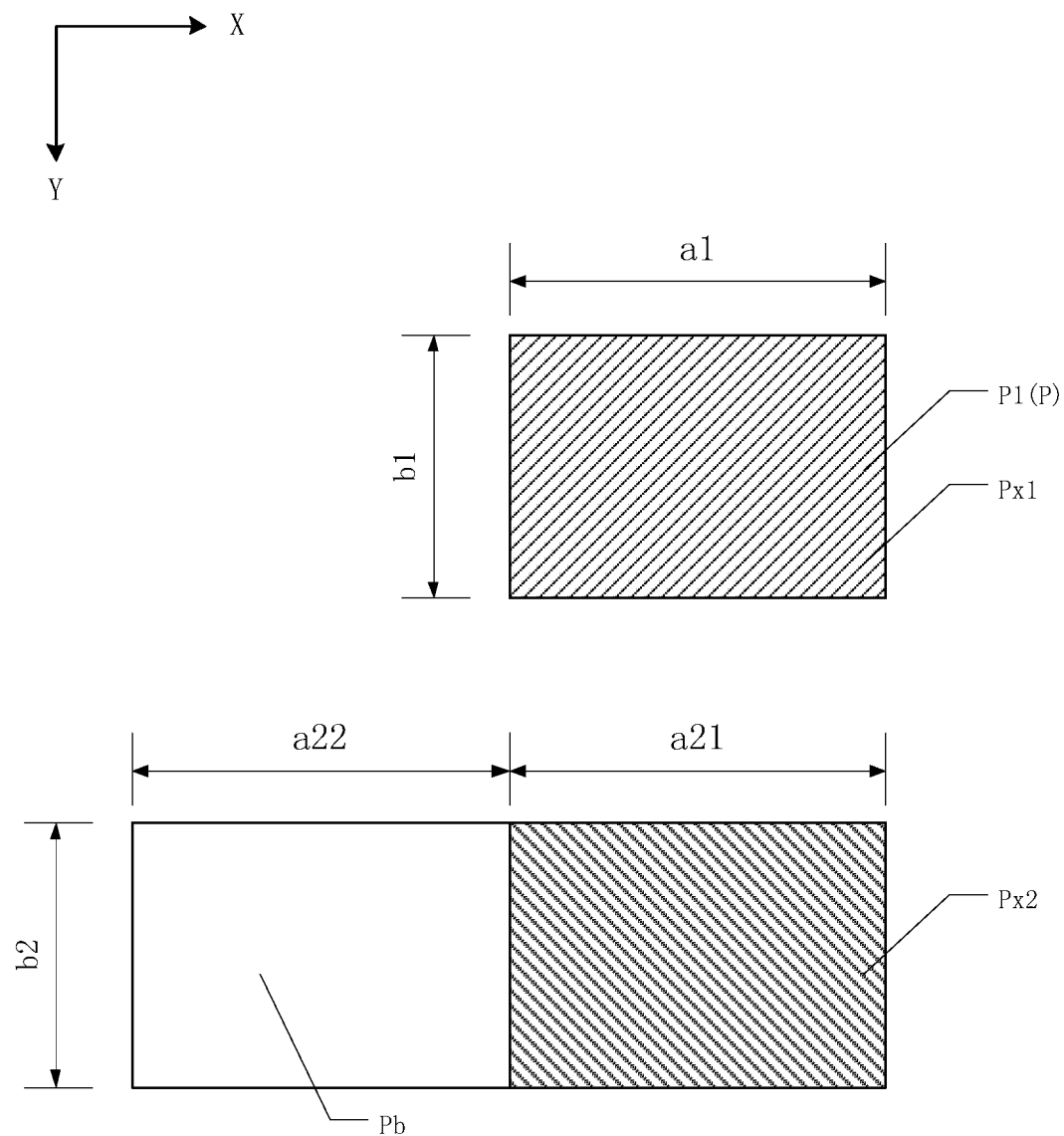
FIG. 6 is a schematic diagram of a first pixel unit and a second pixel unit of another organic light-emitting display panel according to another embodiment of the present disclosure.

Further, referring to FIG. 1 and FIG. 6, the first pixel unit P1 includes a first pixel circuit region Px. The first pixel circuit region Px1 shown in FIG. 6 occupies the entire first pixel unit P1, i.e., the entire area of the first pixel unit P1 is used to arrange the pixel driving circuit. In other words, the first pixel circuit region Px1 has a same area as the first pixel unit P1. The second pixel unit P2 includes a blank region Pb and a second pixel circuit region Px2, i.e., the second pixel circuit region Px2 does not completely occupy the entire second pixel unit P2. In other words, the second pixel unit P2 is configured to have a blank region Pb in which no pixel driving circuit is provided. The second pixel circuit region Px2 has a smaller area than the second pixel unit P2. A length a21 of the second pixel circuit region Px2 in the first direction X is equal to a length a1 of the first pixel circuit region Px1 in the first direction X.

In the organic light-emitting display panel 100 according to the embodiment of the present disclosure, by setting the length a21 of the second pixel circuit region Px2 in the first direction X to be equal to the length a1 of the first pixel circuit region Px1 in the first direction X, pixel driving circuits of the first pixel unit P1 and the second pixel unit P2 can adopt same parameters, so that an aspect ratio of the transistor and consistency between regions where the transistor and the capacitor are located respectively are increased. In this way, the driving capability of the pixel driving circuits of the first pixel unit P1 and the second pixel unit P2 can be ensure to be uniform, thereby increasing the uniformity of the organic light-emitting display panel 100.

Further, referring to FIG. 1 and FIG. 5, the ratio of the length a1 of the first pixel unit P1 in the first direction X to the length a2 of the second pixel unit P2 in the first direction X is 1:2. That is, the length a2 of the second pixel unit P2 in the first direction X is twice the length a1 of the first pixel unit P1 in the first direction X. Referring to FIG. 1 and FIG. 6, a length a22 of the blank region Pb in the first direction X and the length a21 of the second pixel circuit region Px2 in the first direction X are both equal to the length a1 of the first pixel circuit region Px1 in the first direction X. That is, the length a21 of the second pixel circuit region Px2 of the second pixel unit P2 in the first direction X, the length a22 of the blank region Pb of the second pixel unit P2 in the first direction X, and the length a1 of the first pixel unit P1 in the first direction X satisfy a21:a22:a1=1:1:1.

Figure 7:
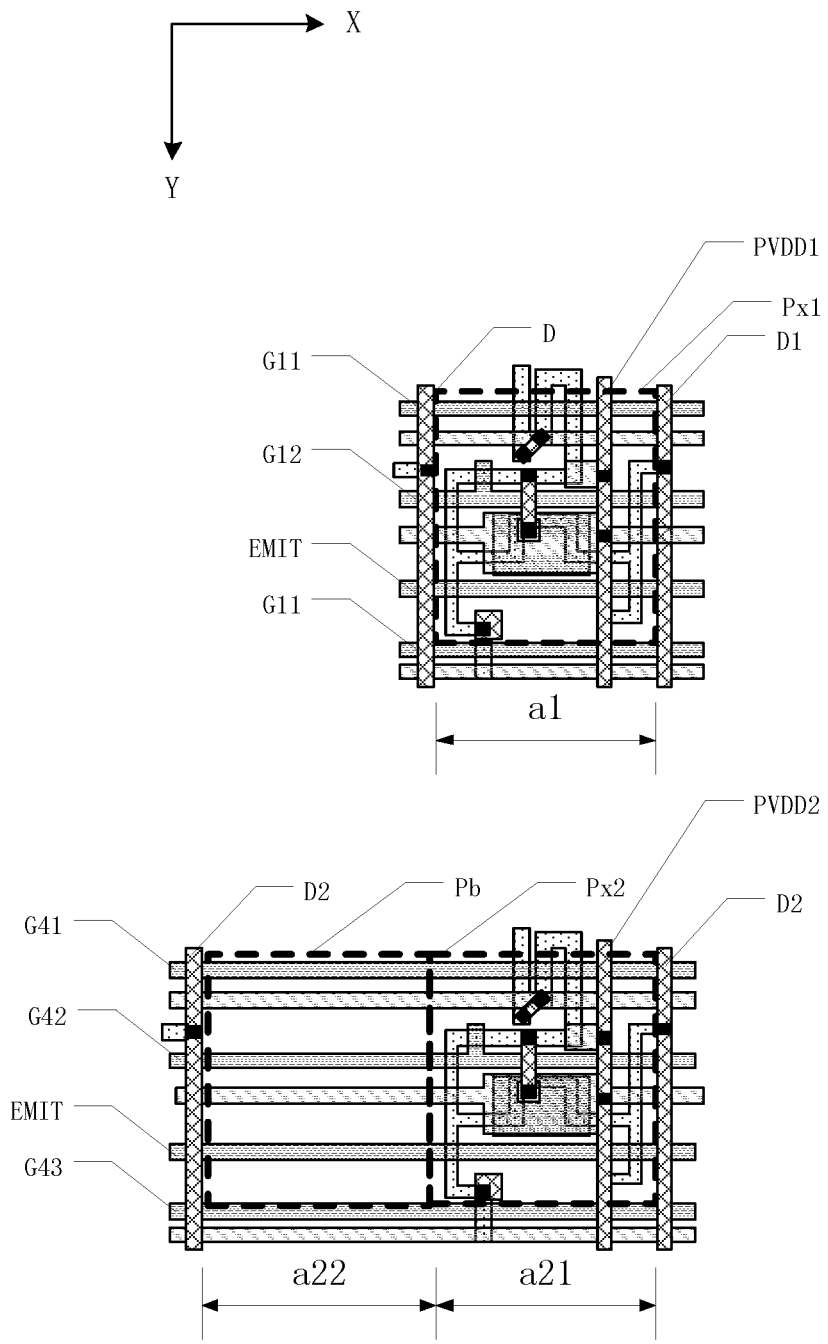
FIG. 7 is a wiring layout of a first pixel unit and a second pixel unit of another organic light-emitting display panel according to an embodiment of the present disclosure.

The organic light-emitting display panel 100 according to the embodiment of the present disclosure, as shown in FIG. 1, FIG. 4 and FIG. 7, further includes first data lines D1, second data lines D2, first power supply signal lines PVDD1 and second power supply signal lines PVDD2.

The first data lines D1 and the first power supply signal lines PVDD1 are located in the full display area 200, i.e., the first data lines D1 and the first power supply signal lines PVDD1 are electrically connected to the first pixel units P1 and configured to provide the data signal DATA and the power supply signal PVDD to the first pixel units P1.

The second data lines D2 and the second power supply signal lines PVDD2 are located in the half display area 210, i.e., the second data lines D2 and the second power supply signal lines PVDD2 are electrically connected to the second pixel units P2 and configured to provide the data signal DATA and the power supply signal PVDD to the second pixel units P2.

FIG. 7 shows layouts of pixel driving circuits of the first pixel units P1 and the second pixel unit P2 in the organic light-emitting display panel 100. In other embodiments of the present disclosure, the pixel driving circuits of the first pixel units P1 and the second pixel unit P2 may also adopt other layouts and driving modes.

As shown in FIG. 7, a length of the first data line D1 in the first direction X is equal to a length of the second data line D2 in the first direction X. A length of the first power supply signal line PVDD1 in the first direction X is equal to a length of the second power supply signal line PVDD2 in the first direction X.

As shown in FIG. 7, a pixel driving circuit capable of driving the first pixel units P1 is provided in a region between two adjacent first data lines D1, which the region can be referred as a first pixel circuit region Px1. In FIG. 7, the first pixel circuit region Px1 has a length a1 in the first direction X. Another pixel driving circuit capable of driving the second pixel units P2 is provided in a region between two adjacent second data lines D2, which the region can be referred as a second pixel circuit region Px2. In FIG. 7, the second pixel circuit region Px2 has a length a21 in the first direction X. The length a1 of the first pixel circuit region Px1 in the first direction X is equal to the length a21 of the second pixel circuit region Px2 in the first direction X. As shown in FIG. 7, the second pixel unit P2 further includes a blank region Pb which is a circuit element of the pixel driving circuit, such as a transistor and a capacitor. The blank region Pb has a greater light transmittance than the second pixel circuit region Px2. Since the second pixel unit P2 has the blank region Pb, the second pixel unit P2 has a greater light transmittance than the first pixel unit P1. That is, the half display area 210 has a greater light transmittance per unit area than the full display area 200.

Figure 8:
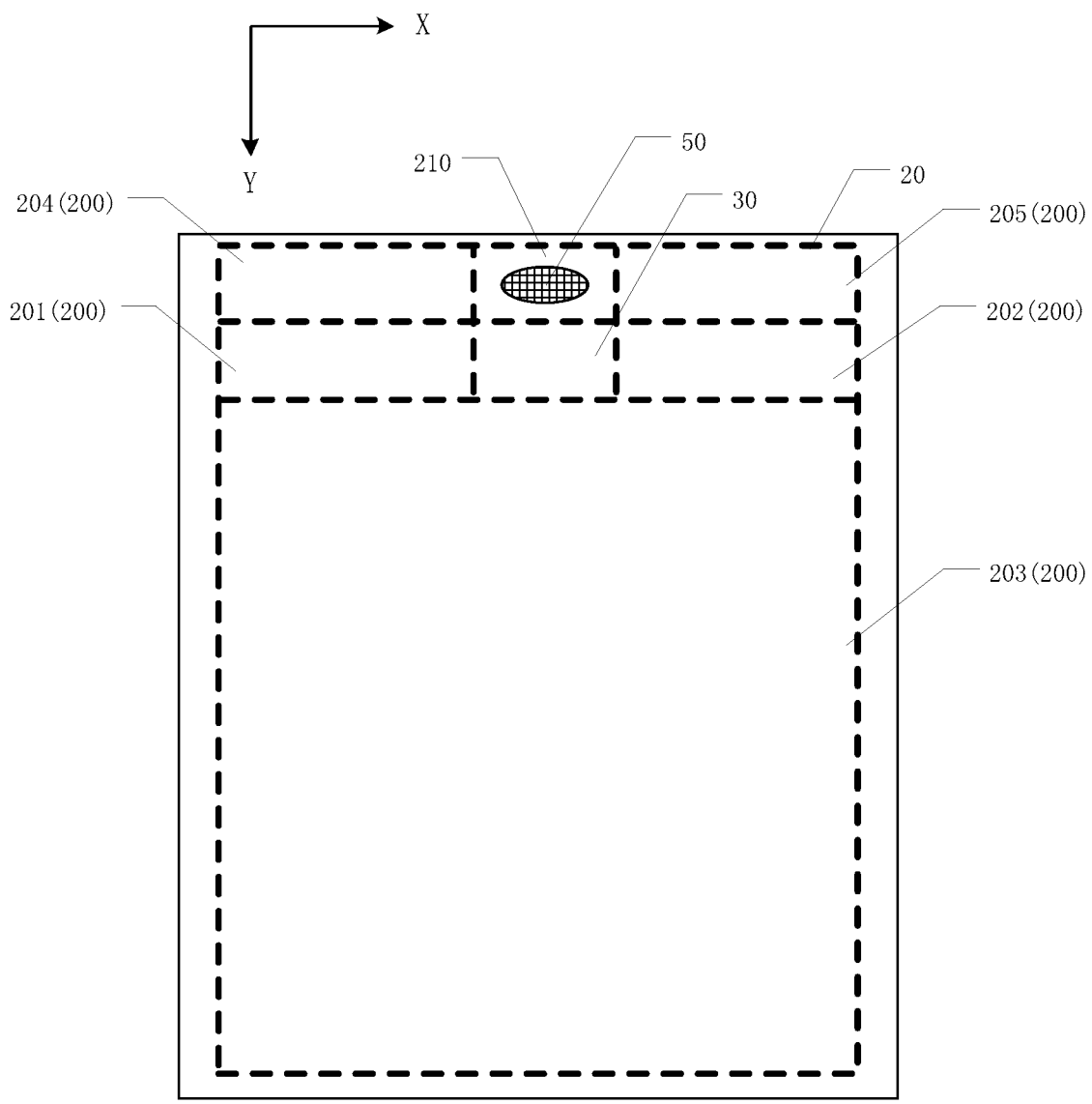
FIG. 8 is a top view of still another organic light-emitting display panel according to yet another embodiment of the present disclosure.

As shown in FIG. 8, the organic light-emitting display panel 100 further includes a sensor 50 located in the half display area 210. The sensor 50 can be a light-sensing fingerprint unit that detects and recognizes a fingerprint using a change in light, and performs unlocking, quick payment, or other operations on the organic light-emitting display panel 100. The sensor 50 may also be a panel recognition unit configured to collect facial information and perform unlocking, quick payment or other operations on the organic light-emitting display panel 100. The sensor 50 may also be a light sensor or a distance sensor configured to detect a distance of a human body or an object from the organic light-emitting display panel 100, and switch between a display mode and a non-display mode in the organic light-emitting display panel 100.

In the organic light-emitting display panel 100 according to the embodiment of the present disclosure, the second pixel units P2 in the half display area 210 each includes the blank region Pb, such that the light transmittance of the half display area 210 is increased, and the sensor is disposed in the half display area 210, such that the half display area 210 has functions of display and sensing control at the same time. This can improve the screen-to-body ratio of the organic light-emitting display panel 100, optimize the additional performance of the organic light-emitting display panel 100 and satisfy the diverse requirements from users.

Figure 9:
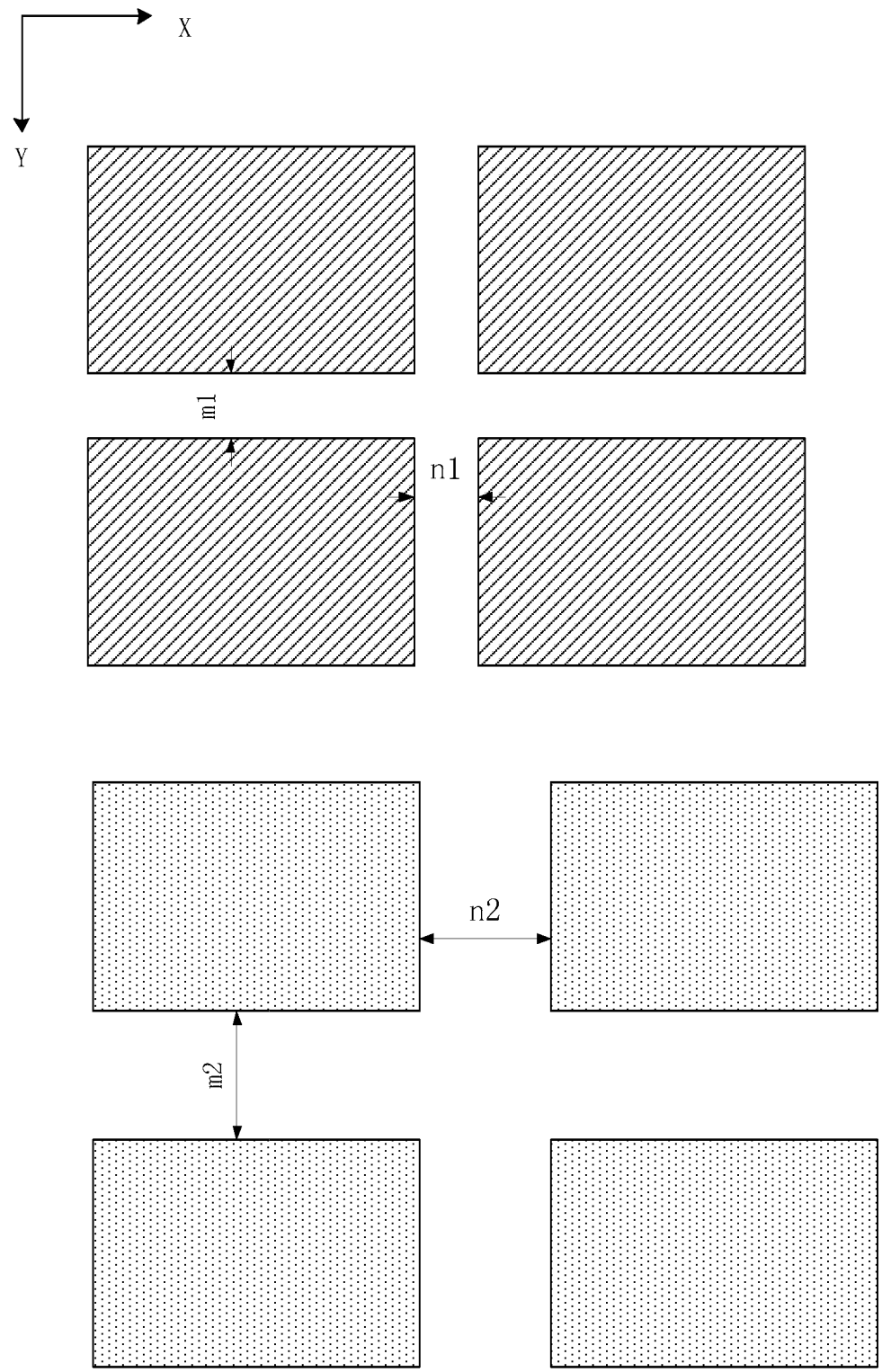
FIG. 9 is a schematic diagram of a first pixel unit and a second pixel unit of still another organic light-emitting display panel according to another embodiment of the present disclosure.

An embodiment of the present disclosure further provides an organic light-emitting display panel 100, as shown in FIGS. 1 and 9. The pixel units P include first pixel units P1 located in the full display area 200 and second pixel units P2 located in the half display area 210.

As shown in FIG. 9, a distance n1 between two adjacent first pixel units P1 in the first direction X is smaller than a distance n2 between two adjacent second pixel units P2 in the first direction X. In addition, a distance m1 between two adjacent first pixel units P1 in the second direction Y is also smaller than a distance m2 between two adjacent second pixel units P2 in the second direction Y. That is, in the organic light-emitting display panel 100 according to the embodiment of the present disclosure, the distance between two adjacent first pixels P1 and the distance between two adjacent second pixel units P2 satisfy at least one of the following relationships: n1<n2 and m1<m2.

Figure 10:
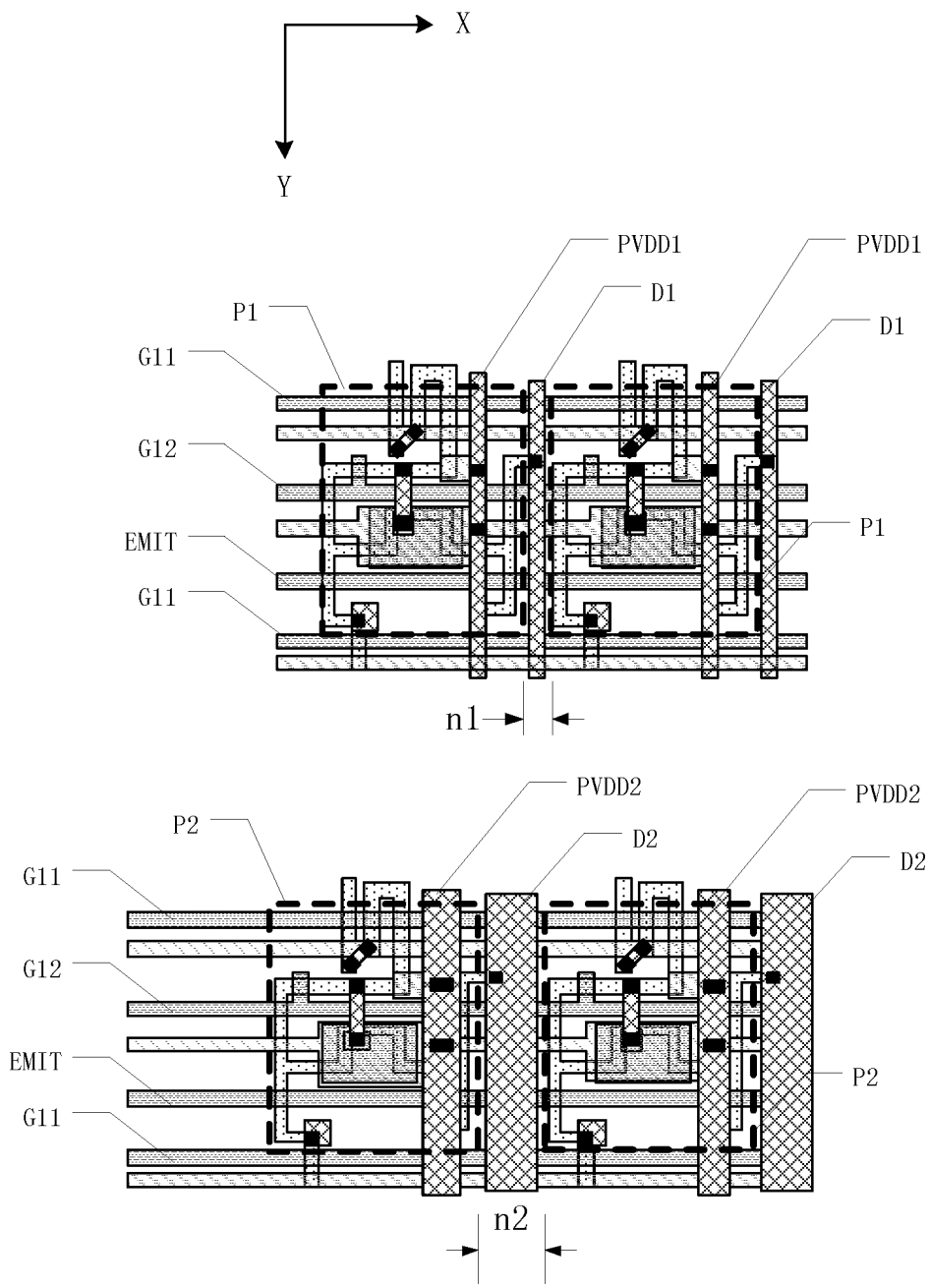
FIG. 10 is a wiring layout of a first pixel unit and a second pixel unit of yet another organic light-emitting display panel according to another embodiment of the present disclosure.

Referring to FIG. 1, FIG. 4 and FIG. 10, the organic light-emitting display panel 100 further includes first data lines D1, second data lines D2, first power supply signal lines PVDD1 and second power supply signal lines PVDD2.

The first data lines D1 and the first power supply signal lines PVDD1 are located in the full display area 200, i.e., the first data lines D1 and the first power supply signal lines PVDD1 are electrically connected to the first pixel units P1 and configured to respectively provide the data signal DATA and the power supply signal PVDD to the first pixel units P1.

The second data lines D2 and the second power supply signal lines PVDD2 are located in the half display area 210, i.e., the second data lines D2 and the second power supply signal lines PVDD2 are electrically connected to the second pixel units P2 and configured to respectively provide the data signal DATA and the power supply signal PVDD to the second pixel units P2.

FIG. 10 shows layouts of pixel driving circuits of the first pixel units P1 and the second pixel unit P2 in the organic light-emitting display panel 100. In other embodiments of the present disclosure, the pixel driving circuits of the first pixel units P1 and the second pixel unit P2 may also adopt other layouts and driving modes.

As shown in FIG. 10, a length of the first data line D1 in the first direction X is smaller than a length of the second data line D2 in the first direction X. A length of the first power supply signal line PVDD1 in the first direction X is smaller than a length of the second power supply signal line PVDD2 in the first direction X. FIG. 10 merely illustrates a case in which the length of the first data line D1 in the first direction X and length of the first power supply signal line PVDD1 in the first direction X are respectively smaller than the length of the second data line D2 in the first direction X and the length of the second power supply signal line PVDD2 in the first direction. However, in other embodiments of the present disclosure, it is only necessary to satisfy one of the following two relationships: the length of the first data line D1 in the first direction X is smaller than the length of the second data line D2 in the first direction X; and the length of the first power supply signal line PVDD1 in the first direction X is smaller than the length of the second power supply signal line PVDD2 in the first direction X.

As shown in FIG. 10, a pixel driving circuit capable of driving the first pixel unit P1 is provided in a region between two adjacent first data lines D1, which the region can be understand as the first pixel unit P1. A distance between two adjacent first pixel units P1 in the first direction X is n1.

As shown in FIG. 10, a pixel driving circuit capable of driving the second pixel unit P2 is provided in a region between two adjacent second data lines D2, which the region can be understand as the second pixel unit P2. A distance between two adjacent second pixel units P2 in the first direction X is n2.

The distance n2 between two adjacent second pixel units P2 in the first direction X is greater than the distance n1 between two adjacent first pixel units P1 in the first direction X is, such that there is space for setting a width of the second data lines D2 to be larger than a width of the first data lines D1 and a width of the second power supply signal line PVDD2 to be larger than a width of the first power supply signal line PVDD1.

Figure 11:
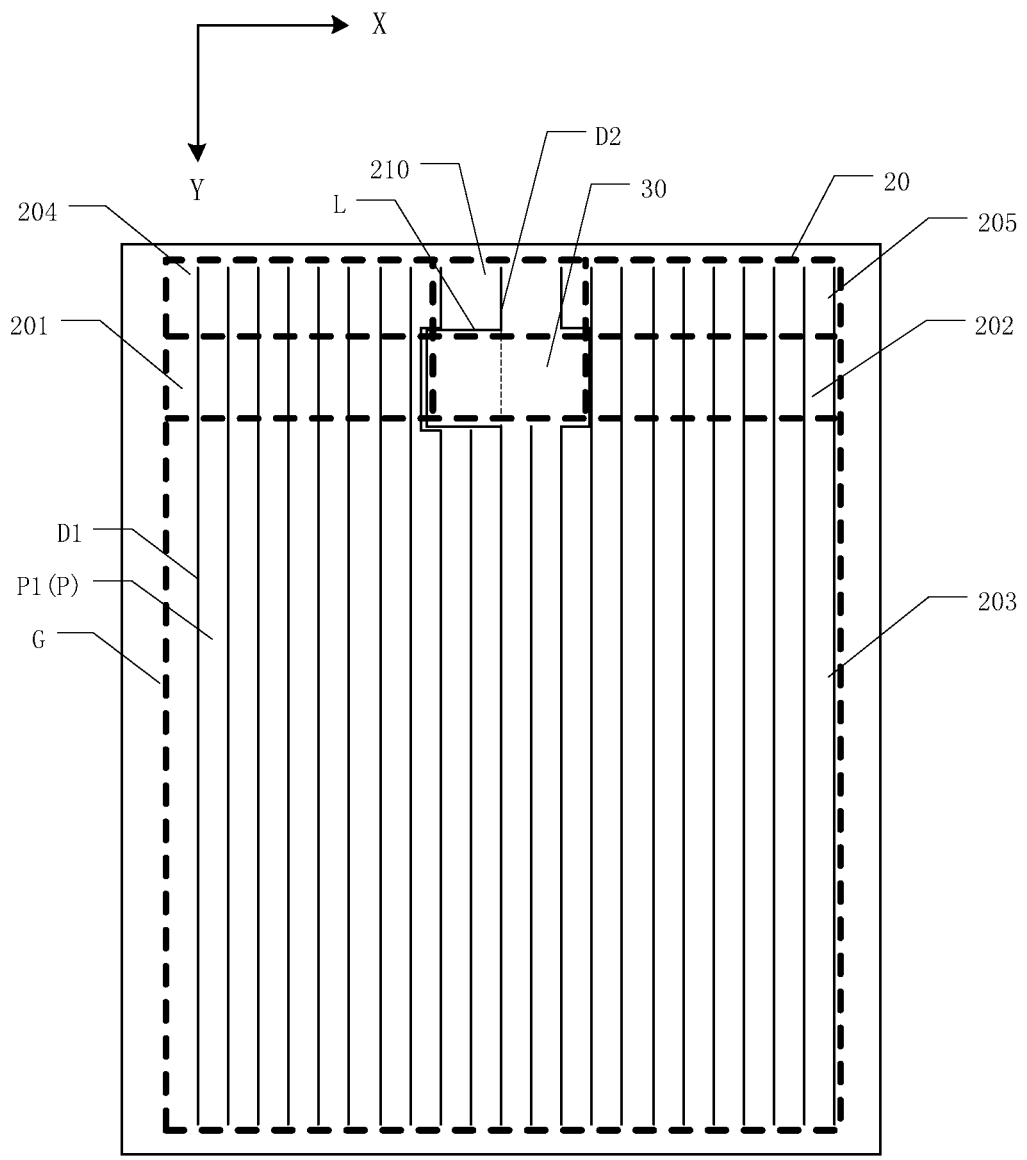
FIG. 11 is a top view of another organic light-emitting display panel according to yet another embodiment of the present disclosure.

Referring to FIG. 11 and FIG. 10, since the second data line D2 is split by the hollow area 30, it is impossible for the second data line D2 to extend to a lower region of the frame along the second direction Y. Therefore, the organic light-emitting display panel 100 according to the embodiment of the present disclosure may further include a data connection line L, the data connection line L is disposed around the hollow area 30. The second data line D2 electrically connected to the second pixel unit P2 is electrically connected to the first data line D1 electrically connected to the first pixel unit P1 through the data connection line L.

Further referring to FIG. 11, an extension line of the second data line D2 overlaps with the first data line D1 that is electrically connected to the second data line D2 through the data connection line L. That is, the second data line D2 and the first data line D1 electrically connected to each other through the data connection line L are located in a same column along the second direction Y.

In the organic light-emitting display panel 100 according to the embodiment of the present disclosure, by setting the distance between two adjacent second pixel units P2 to be greater than the distance between two adjacent first pixel units P1, a width of the second data lines D2 and/or a width of the second power supply signal line PVDD2 in the first direction X can be increased. In this way, a resistance of the second data line D2 and/or a resistance of the second power supply signal line PVDD2 is reduced due to the winding, so that electrical signal losses of the first data line D1 and the second data line D2 tend to be same, which can enhance the uniformity of the organic light-emitting display panel 100 according to the embodiment of the present disclosure.

Figure 12:
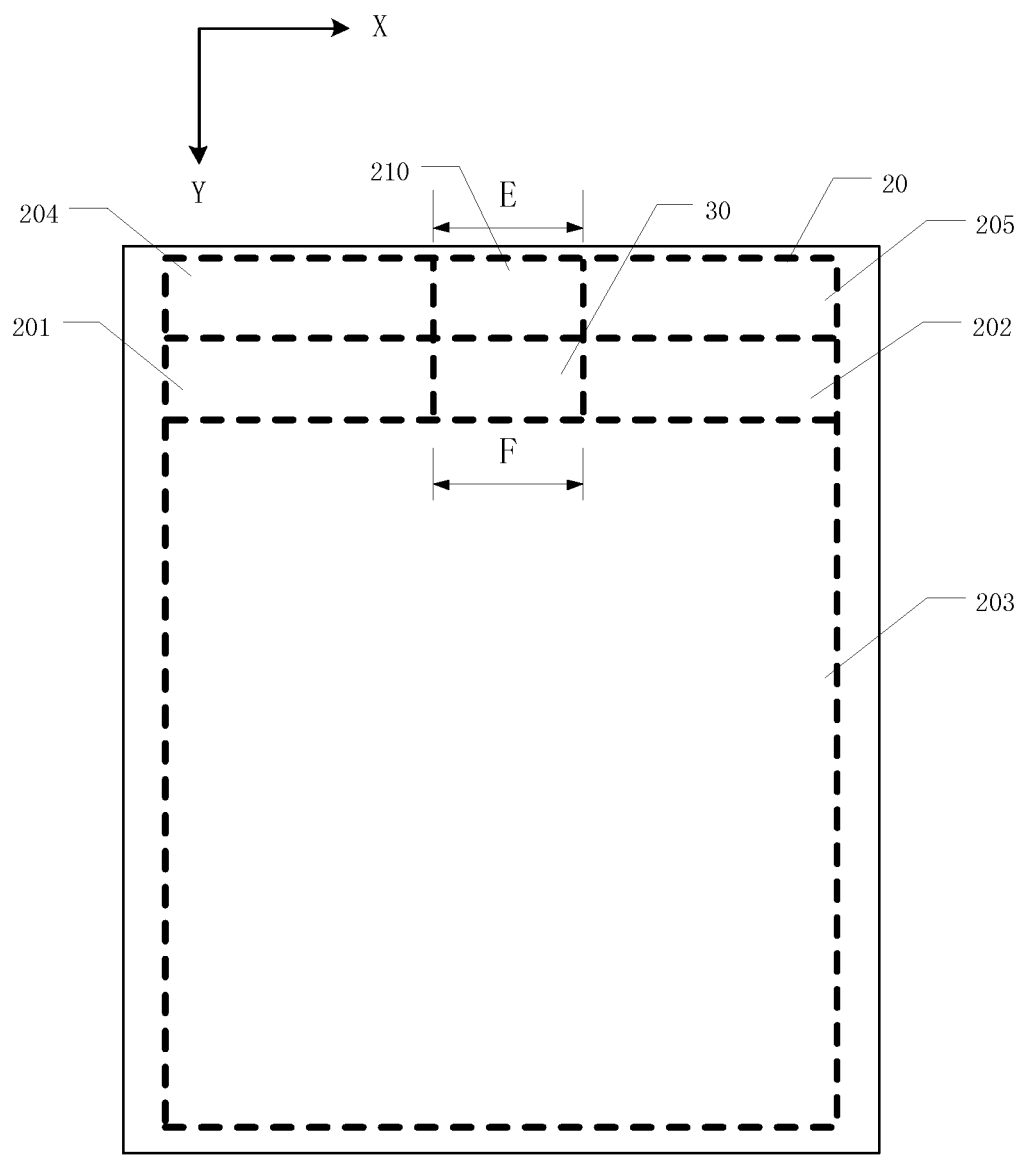
FIG. 12 is a top view of another organic light-emitting display panel according to yet another embodiment of the present disclosure.

Another embodiment of the present disclosure provides an organic light-emitting display panel 100, as shown in FIG. 12. The half display area 210 is rectangular, and a length E of the half display area 210 in the first direction X is equal to a length F of the hollow area 30 in the direction X.

With reference to FIG. 12, the display area 20 of the organic light-emitting display panel 100 is in a rectangular shape, and the four sides of the hollow area 30 are parallel to the four sides of the display area 20, respectively. A first side, a second side, a third side and a fourth side of the hollow area 30 are connected in the rectangular shape in a counterclockwise direction. A first side, a second side, a third side and a fourth side of the display area 20 are connected in the rectangular shape in a counterclockwise direction.

A distance between the first side of the hollow area 30 and the first side of the display area 20 is the minimum distance from the hollow area 30 to the display area 20.

Four sides of the hollow area 30 respectively extend to three sides of the display area 20 to obtain respective extension lines. The half display area 210 is formed by the first side of the hollow area 30, the first side of the display area 20, the extension line of the second side of the hollow area 30 and the extension line of the fourth side of the hollow area 30.

The first display region 201 is formed by the second side of the hollow area 30, the second side of the display area 20, the extension line of the first side of the hollow area 30, and the extension line of the third side of the hollow area 30.

The second display region 202 is formed by the fourth side of the hollow area 30, the fourth side of the display area 20, the extension line of the first side of the hollow area 30, and the extension line of the third side of the hollow area 30.

The third display region 203 is formed by the second side of the display area 20, the third side of the display area 20, the fourth side of the display area 20, and the extension line of the third side of the hollow area 30.

The fourth display region 204 is formed by the first side of the display area 20, the second side of the display area 20, the extension line of the first side of the hollow area 30, and the extension line of the second side of the hollow area 30.

The fifth display region 205 is formed by the first side of the display area 20, the fourth side of the display area 20, the extension line of the first side of the hollow area 30, and the extension line of the fourth side of the hollow area 30.

Figure 13:
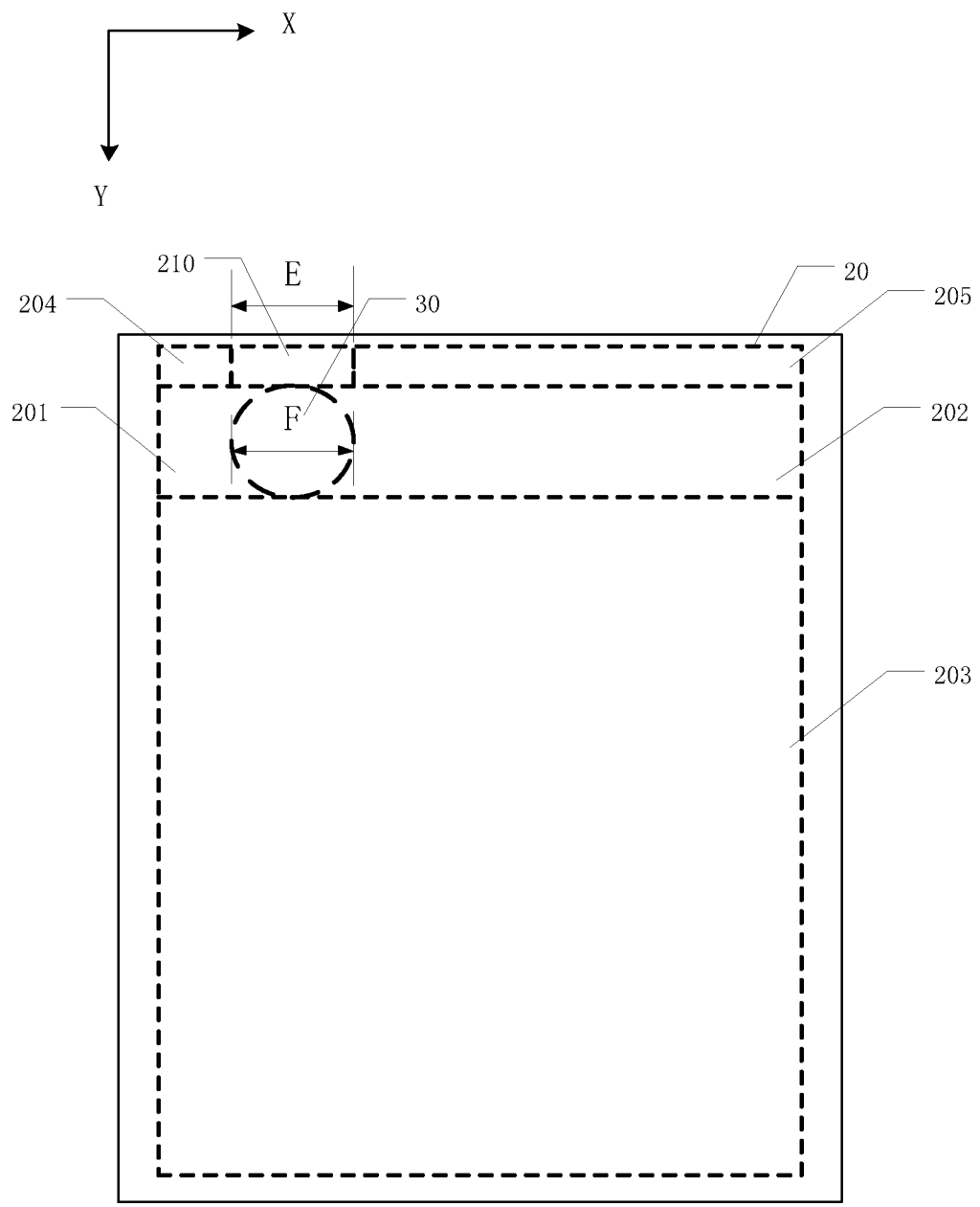
FIG. 13 is a top view of another organic light-emitting display panel according to yet another embodiment of the present disclosure.

Another embodiment of the present disclosure provides an organic light-emitting display panel 100, as shown in FIG. 13. The hollow area 30 is in a round shape, and a length E of the half display area 210 in the first direction X is equal to a diameter F of the hollow area 30. A first side, a second side, a third side and a fourth side of the display area 20 are connected in a rectangular shape in a counterclockwise direction.

With reference to FIG. 13, when the hollow area 30 is round, four tangent lines of the round hollow area 30 are a tangent line made through a point closest to the first side of the display area 20 on the perimeter of the hollow area 30, a tangent line made through a point farthest from the first side of the display area 20 on the perimeter of the hollow area 30, a tangent line made through a point closest to the second side of the display area 20 on the perimeter of the hollow area 30, and a tangent line made through a point farthest from the second side of the display area 20 on the perimeter of the hollow area 30. The above four tangent lines of the hollow area 30 and the sides of the display area 20 respectively form the half display area 210, the first display region 201, the second display region 202, the third display region 203, the fourth display region 204, and the fifth display region 205, which will not repeated herein.

Figure 14:
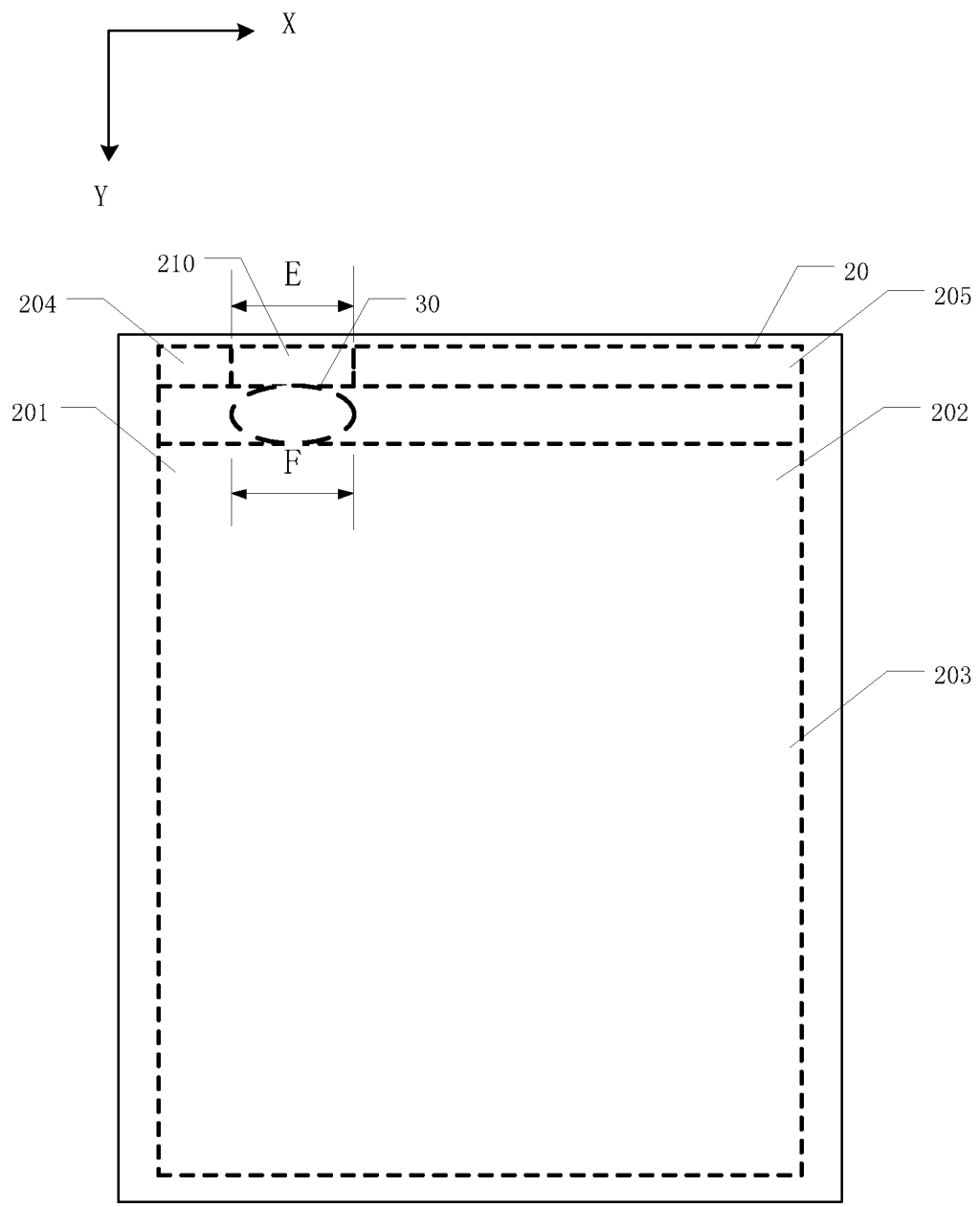
FIG. 14 is a top view of another organic light-emitting display panel according to yet another embodiment of the present disclosure.

Another embodiment of the present disclosure provides an organic light-emitting display panel 100, as shown in FIG. 14. The hollow area 30 is in an oval shape, and a length E of the half display area 210 in the first direction X is equal to a length of the hollow area 30 in the direction X. A first side, a second side, a third side and a fourth side of the display area 20 are connected in a rectangular shape in a counterclockwise direction. When the major or minor axis of the hollow area 30 is parallel to one side of the display area 20, the length E of the half display area 210 in the first direction X is a length of the major or minor axis of the hollow area 30.

With reference to FIG. 14, when the hollow area 30 is oval, four tangent lines of the oval hollow area 30 are tangent lines made through ends of the major and minor axes of the hollow area 30. The four tangent lines of the hollow area 30 and the sides of the display area 20 respectively form the half display area 210, the first display region 201, the second display region 202, the third display region 203, the fourth display region 204, and the fifth display region 205, which will not repeated herein.

In the organic light-emitting display panel 100 according to the embodiments of the present disclosure, the half display area 210 is arranged based on the shape and positional relationship between the hollow area 30 and the display area 20, so as to avoid arranging the half display area 210 in a visually sensitive region. In this way, the number of pixel units P per unit area of the half display area 210 can be reduced to arrange a sensor or perform uniformity of resistance, so that the user's visual experience can be optimized while the screen-to-body ratio of the organic light-emitting display panel 100 can be increased.

Figure 15:
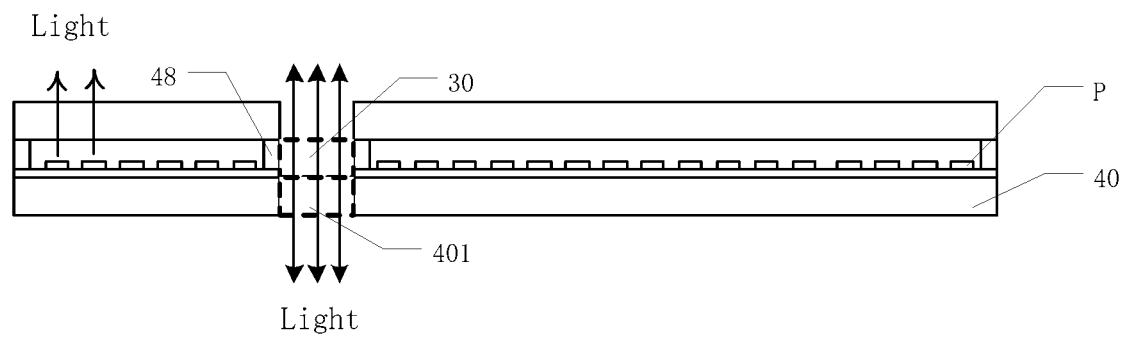
FIG. 15 is a side view of an organic light-emitting display panel according to an embodiment of the present disclosure.

An embodiment of the present disclosure further provides an organic light-emitting display panel 100, as shown in FIG. 1 and FIG. 15. The organic light-emitting display panel 100 further includes a substrate 40, and gate lines G, data lines D, and pixel units P are disposed on the substrate 40. Each pixel unit P is provided with a pixel driving circuit and a light-emitting element. The light-emitting element includes a cathode, an anode, and a light-emitting layer arranged between the cathode and the anode.

With reference to FIGS. 1 and 15, the substrate 40 has a hollow portion 401, which is a through-hole provided in the substrate 40. The hollow portion 401 overlaps with the hollow area 30 such that light can go through the hollow area 30 and the hollow portion 401 from either side of the organic light-emitting display panel 100 to the other side. There is no substrate 40 at the hollow portion 401, and the hollow area 30 is not provided with any circuit element of the pixel unit P, the gate line G, and the data line D. A through-hole is formed in the entire organic light-emitting display panel 100 in the hollow area 30.

Further, the periphery of the hollow area 30 should be packaged to prevent water or oxygen from entering the inside of the organic light-emitting display panel 100, and the organic light-emitting display panel 100 further includes a package device 48. The package device 48 can be an inorganic layer, an organic layer, or a multilayer film package of inorganic layers. The package device 48 also can be formed by disposing a package metal on the substrate 40, coating with lass paste and performing a laser melting encapsulation. Since the display area 20 of the organic light-emitting display panel 100 includes the pixel units, the organic light-emitting display panel 100 can emit light to a side away from the substrate 40 in the display area 20, but light cannot penetrate the substrate 40.

In the organic light-emitting display panel 100 according to the embodiment of the present disclosure, since the substrate 40 is provided with the hollow portion 401 overlapping with the hollow area 30, the organic light-emitting display panel 100 has a through-hole in the hollow area 30, in which a sensing or acquisition device, such as image acquisition device or earpiece, can be embedded into the interior of the organic light-emitting display panel 100, thereby reducing the thickness of the organic light-emitting display panel 100.

Figure 16:
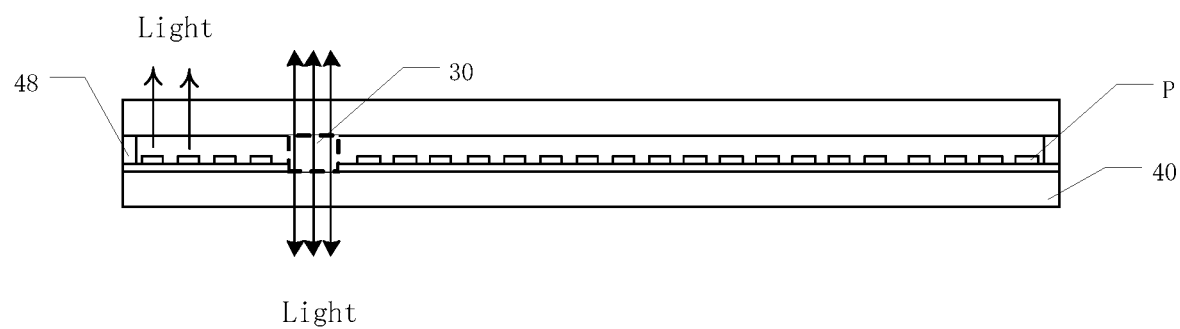
FIG. 16 is a side view of another organic light-emitting display panel according to another embodiment of the present disclosure.

An embodiment of the present disclosure further provides an organic light-emitting display panel 100, as shown in FIG. 1 and FIG. 16. The organic light-emitting display panel 100 further includes a substrate 40, a plurality of gate lines G, a plurality of data lines D, and a plurality of pixel units P disposed on the substrate 40. The hollow area 30 is covered by the substrate 40. No pixel unit P is provided in the hollow area 30. However, the gate line G, the data line D, or other organic layer and insulation layer can be provided in the hollow area 30 according the practical requirement. The hollow area 30 is a transparent region such that light can go through the hollow area 30 from either side of the organic light-emitting display panel 100 to the other side.

The hollow region 30 is already sealed due to the complete substrate 40 of the organic light-emitting display panel 100, so that package parts at the periphery of the hollow area 30 are unnecessary. It is only needed to provide package parts 48 at the periphery of the organic light-emitting display panel 100. The package device 48 can be an inorganic layer, an organic layer, or a multilayer film package of inorganic layers. The package part 48 also can be formed by disposing a package metal on the substrate 40, coating with lass paste and performing a laser melting encapsulation. Since the display area 20 of the organic light-emitting display panel 100 includes the pixel units, the organic light-emitting display panel 100 can emit light to a side away from the substrate 40 in the display area 20, but light cannot penetrate the substrate 40.

In the organic light-emitting display panel 100 according to the embodiment of the present disclosure, by providing the complete substrate 40 and the transparent hollow area 30, the organic light-emitting display panel 100 has a virtual hole in the hollow area 30, in which a sensing or acquisition device, such as image acquisition device or earpiece, can be arranged at the outside of the substrate 40 of the organic light-emitting display panel 100 but in correspondence to the hollow region 30. In this way, packaging the hollow area 30 can be avoided, so as simplify the process. In the meantime, the area to be sealed of the organic light-emitting display panel 100 can be also reduced, such that the water or oxygen can be further prevented from entering, and thus the service life of the organic light-emitting display panel 100 can be prolonged.

Figure 17:
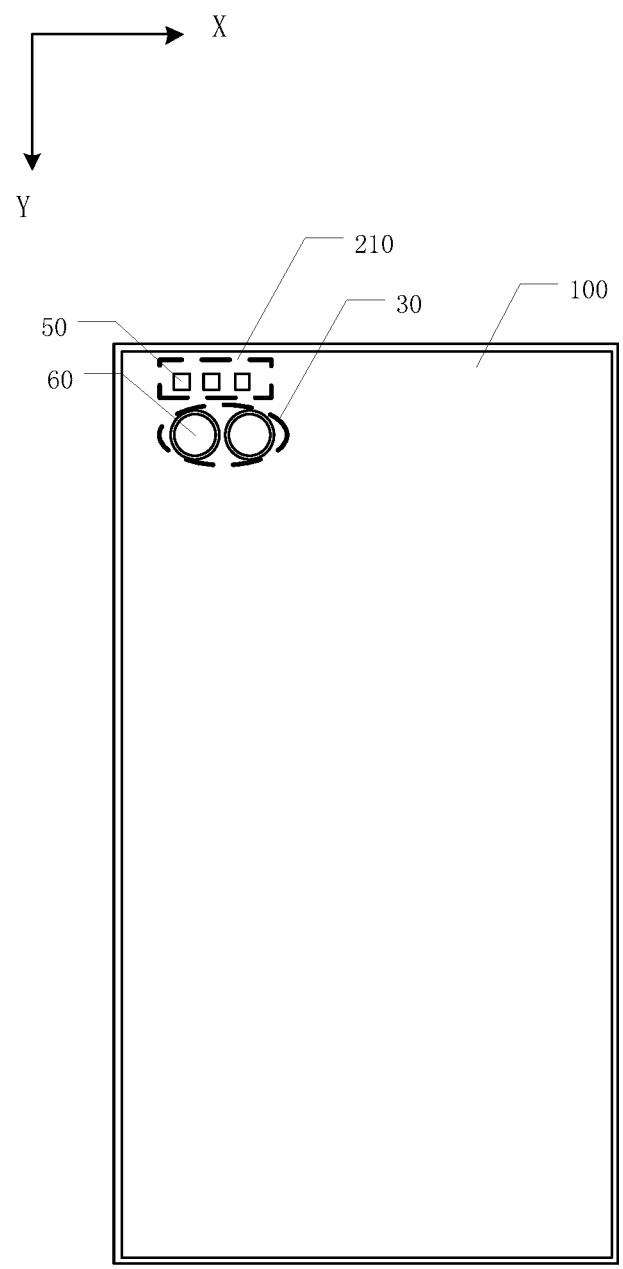
FIG. 17 is a top view of an organic light-emitting display device according to an embodiment of the present disclosure.

An embodiment of the present disclosure further provides an organic light-emitting display device 500, as shown in FIG. 17, which includes the organic light-emitting display panel 100 according to any one of the embodiments of the present disclosure. The organic light-emitting display device 500 further includes an image acquisition device 60 or a sound production device 60. The image acquisition device 60 or the sound production device 60 is disposed in the hollow region 30 of the organic light-emitting display panel 100. The image acquisition device 60 can be, for example, a camera, an image collector, or other devices capable of photographing, videotaping, image capturing and recognition. The sound production device 60 can be an earpiece, a sounder or other devices that can produce sound by vibration.

The organic light-emitting display device 500 can further include a sensor 50 located in the half display area 210. The sensor 50 can be a light-sensing fingerprint unit that detects and recognizes a fingerprint using a change in light, and performs unlocking, quick payment, or other operations on the organic light-emitting display device 500. The sensor 50 may also be a panel recognition unit configured to collect facial information and perform unlocking, quick payment or other operations on the organic light-emitting display device 500. The sensor 50 can also be a light sensor or a distance sensor configured to detect a distance of a human body or an object from the organic light-emitting display device 500, and switch between a display mode and a non-display mode in the organic light-emitting display panel 100.

In the organic light-emitting display device 500 provided by the embodiment of the present disclosure, the hollow area 30, and the half display area 210 and the full display area 200 surrounding the hollow area 30 are provided, and the number of the pixel units P per unit area of the full display area 200 is larger than the number of the pixel units P per unit area of the half display area 210. In this way, it is possible in the organic light-emitting display device 500 that not only an independent sensor module or acquisition module can be provided in the hollow area 30 at the center of the organic light-emitting display panel 100, but a sensing unit 50 located in the organic light-emitting display panel 100 can be integrated in the half display area 210 and serve to display. Therefore, a ratio of a displayable area of the organic light-emitting display device 500 to a total area of the organic light-emitting display device 500 can be increased, which can improve the user experience.

It should be understood that FIG. 17 is merely one example of the organic light-emitting display device 500. The organic light-emitting display device 500 is not limited to the shape or the state shown in FIG. 17. The organic light-emitting display device 500 may be rectangular or non-rectangular. The organic light-emitting display device 500 may have no frame at all, or may have at least one frame.

The above embodiments are merely preferable embodiments of the present disclosure, which are not intended to limit the present disclosure. Any modification, equivalent replacement and improvement within the spirit and principle of the present disclosure shall fall into the scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. An organic light-emitting display panel, having a hollow area and a display area surrounding the hollow area, comprising:
    a plurality of pixel units;
    a plurality of gate lines; and
    a plurality of data lines, wherein the plurality of data lines and the plurality of gate lines intersect with one another and the plurality of data lines are insulated from the plurality of gate lines,
    wherein none of the plurality of pixel units is provided within the hollow area, and the plurality of pixel units is provided in a periphery of the hollow area,
    the display area comprises a full display area and a half display area, and the full display area comprises a first display region, a second display region, a third display region, a fourth display region, and a fifth display region,
    the first display region, the hollow area and the second display region are sequentially arranged along a first direction,
    the half display area, the hollow area, and the third display region are sequentially arranged along a second direction, and
    a number of pixel units per unit area in the full display area is greater than a number of pixel units per unit area in the half display area.

2. The organic light-emitting display panel according to claim 1, wherein the organic light-emitting display panel comprises a first gate driving unit and a second gate driving unit,
    the first gate driving unit, the first display region, the hollow area, the second display region, and the second gate driving unit are sequentially arranged in the first direction,
    pixel units located in the first display region of the plurality of pixel units are electrically connected to the first gate driving unit and insulated from the second gate driving unit, and
    pixel units located in the second display region of the plurality of pixel units are electrically connected to the second gate driving unit and insulated from the first gate driving unit.

3. The organic light-emitting display panel according to claim 2, wherein the organic light-emitting display panel comprises a plurality of first gate lines located in the first display region and a plurality of second gate lines located in the second display region, and
    the hollow area is located between the plurality of first gate lines and the plurality of second gate lines, so as to insulate the plurality of first gate lines from the plurality of second gate lines.

4. The organic light-emitting display panel according to claim 1, wherein the organic light-emitting display panel comprises a third gate driving unit, a fourth gate driving unit, a fifth gate driving unit, and a sixth gate driving unit,
    the third gate driving unit, the third display region, and the fourth gate driving unit are sequentially arranged along the first direction,
    pixel units located in the third display region of the plurality of pixel units are electrically connected to both the third gate driving unit and the fourth gate driving unit,
    the fifth gate driving unit, the fourth display region, the half display area, the fifth display region and the sixth gate driving unit are sequentially arranged along the first direction, and
    pixel units located in the fourth display region, the half display area and the fifth display region of the plurality of pixel units are electrically connected to both the fifth gate driving unit and the sixth gate driving unit.

5. The organic light-emitting display panel according to claim 4, wherein the organic light-emitting display panel comprises a plurality of third gate lines located in the third display region and a plurality of fourth gate lines,
    each of the plurality of third gate lines has a first end electrically connected to the third gate driving unit and a second end electrically connected to the fourth gate driving unit, and
    the plurality of fourth gate lines extends from the fourth display region along the first direction, passes through the half display area, and extends to the fifth display region, and each of the plurality of fourth gate lines has a first end electrically connected to the fifth gate driving unit and a second end electrically connected to the sixth gate driving unit.

6. The organic light-emitting display panel according to claim 1, wherein the plurality of pixel unit comprises a first pixel unit located in the full display area and a second pixel unit located in the half display area, and a length of the first pixel unit in the first direction is smaller than a length of the second pixel unit in the first direction.

7. The organic light-emitting display panel according to claim 6, wherein the first pixel unit comprises a first pixel circuit region, the second pixel unit comprises a blank region and a second pixel circuit region, and a length of the second pixel circuit region in the first direction is equal to a length of the first pixel circuit region in the first direction.

8. The organic light-emitting display panel according to claim 7, wherein a ratio of a length of the first pixel unit in the first direction to a length of the second pixel unit in the first direction is 1:2.

9. The organic light-emitting display panel according to claim 8, wherein a length of the blank region in the first direction is equal to the length of the first pixel unit in the first direction.

10. The organic light-emitting display panel according to claim 6, wherein the organic light-emitting display panel further comprises a first data line, a second data line, a first power supply signal line and a second power supply signal line, the first data line and the first power supply signal line are located in the full display area,
the second data line and the second power supply signal line are located in the half display area,
a length of the first data line in the first direction is equal to a length of the second data line in the first direction, and
a length of the first power supply signal line in the first direction is equal to a length of the second power supply signal line in the first direction.

11. The organic light-emitting display panel according to claim 6, wherein the organic light-emitting display panel further comprises a sensor located in the half display area.

12. The organic light-emitting display panel according to claim 6, wherein a width of the first pixel unit in the second direction is equal to a width of the second pixel unit in the second direction.

13. The organic light-emitting display panel according to claim 1, wherein the plurality of pixel units comprises a plurality of first pixel units located in the full display area and a plurality of second pixel units located in the half display area, and a distance between two adjacent first pixel units of the plurality of first pixel units is smaller than a distance between two adjacent second pixel units of the plurality of second pixel units.

14. The organic light-emitting display panel according to claim 13, wherein the organic light-emitting display panel further comprises a plurality of first data lines, a plurality of second data line, a plurality of first power supply signal lines and a plurality of second power supply signal lines, the plurality of first data lines and the plurality of the first power supply signal lines are located in the full display area,
the plurality of second data lines and the plurality of second power supply signal lines are located in the half display area, and
a length of each of the plurality of first data lines in the first direction is smaller than a length of each of the plurality of second data lines in the first direction, and/or a length of each of the plurality of first power supply signal lines in the first direction is smaller than a length of each of the plurality of second power supply signal lines in the first direction.

15. The organic light-emitting display panel according to claim 14, wherein the organic light-emitting display panel further comprises a data connection line disposed around the hollow area, and
at least one of the plurality of second data lines electrically connected to corresponding ones of the plurality of second pixel units is electrically connected to at least one of the plurality of first data lines electrically connected to corresponding ones of the plurality of first pixel units through the data connection line.

16. The organic light-emitting display panel according to claim 15, wherein an extension line of each second data line of the plurality of second data lines overlaps with a corresponding one of the plurality of first data lines electrically connected to the second data line through the data connection line.

17. The organic light-emitting display panel according to claim 1, wherein the half display area is in a rectangular shape, and a length of the half display area in the first direction is equal to a length of the hollow area in the first direction.

18. The organic light-emitting display panel according to claim 17, wherein the hollow area is in a round shape, and a length of the half display area in the first direction is equal to a diameter of the hollow area.

19. The organic light-emitting display panel according to claim 17, wherein the hollow area is in an oval shape, and a length of the half display area in the first direction is equal to a length of the hollow area in the first direction.

20. The organic light-emitting display panel according to claim 1, wherein the organic light-emitting display panel further comprises a substrate, and a plurality of gate lines, a plurality of data lines, and a plurality of pixel units disposed on the substrate.

21. An organic light-emitting display device, comprising the organic light-emitting display panel according to claim 1.

22. The organic light-emitting display device according to claim 21, further comprising an image acquisition device or a sound production device, wherein the image acquisition device or the sound production device is disposed in the hollow area of the organic light-emitting display panel.

* * * * *